Feb. 14, 1967 TAKASHI YAMANAKA ETAL 3,304,517

INPUT CONTROL VOLTAGE FOR OSCILLATOR COMBINED WITH OSCILLATOR OUTPUT TO STOP OSCILLATOR

Filed May 19, 1965 5 Sheets-Sheet 1

Fig. I

INVENTORS

TAKASHI YAMANAKA, TADASHI KANNO, KOUKICHI ATSUMI, EIJU MATSUMOTO, & YUTAKA ISHIKAWA

BY Hill, Sherman, Meroni, Gross & Simpson ATTORNEYS

INVENTORS
TAKASHI YAMANAKA, TADASHI KANNO,
KOUKICHI ATSUMI, EIJU MATSUMOTO,
& YUTAKA ISHIKAWA

BY Hill, Sherman, Meroni, Gross & Simpson ATTORNEYS

INVENTORS
TAKASHI YAMANAKA, TADASHI KANNO,
KOUKICHI ATSUMI, EIJU MATSUMOTO,
& YUTAKA ISHIKAWA
BY Hill, Sherman, Meroni, Gross & Simpson ATTORNEYS INVENTORS
TAKASHI YAMANAKA, TADASHI KANNO,
KOUKICHI ATSUMI, EIJU MATSUMOTO,
& YUTAKA ISHIKAWA
BY Hill, Sherman, Meroni, Gross & Simpson
ATTORNEYS Feb. 14, 1967 TAKASHI YAMANAKA ETAL 3,304,517

INPUT CONTROL VOLTAGE FOR OSCILLATOR COMBINED WITH OSCILLATOR OUTPUT TO STOP OSCILLATOR

Filed May 19, 1965 5 Sheets-Sheet 5

INVENTORS
TAKASHI YAMANAKA, TADASHI KANNO, KOUKICHI ATSUMI, EIJU MATSUMOTO, & YUTAKA ISHIKAWA

BY Hill, Sherman, Meroni, Gross & Simpson ATTORNEYS

United States Patent Office 3,304,517
Patented Feb. 14, 1967

3,304,517

INPUT CONTROL VOLTAGE FOR OSCILLATOR COMBINED WITH OSCILLATOR OUTPUT TO STOP OSCILLATOR

Takashi Yamanaka, Tadashi Kanno, Koukichi Atsumi, Eiju Matsumoto, and Yutaka Ishikawa, Musashino-shi, Tokyo, Japan, assignors to Yokogawa Denki Seisakusho (Yakogawa Electric Works Ltd.), Musashino-shi, Tokyo, Japan, a corporation of Japan Filed May 19, 1965, Ser. No. 457,142
Claims priority, application Japan, May 30, 1964, 39/42,074; July 18, 1964, 39/41,001, 39/41,003
4 Claims. (Cl. 331—112)

This invention relates to an amplifier, more particularly to an oscillatory-type amplifier apparatus provided with an oscillator circuit whose oscillation is controlled according to the polarity of an input voltage and an output circuit consisting of a transistor amplifier to be turned on and off by the oscillating output of the oscillator circuit and a circuit for smoothing the output of the amplifier, in which the output of the output circuit is negatively fed back to the input side of the oscillator circuit.

It is an object of this invention to provide an oscillatory-type amplifier apparatus comprising an oscillator circuit whose oscillation is controlled in accordance with the polarity of an input voltage, a transistor amplifier adapted to be switched on and off by the output of said oscillator circuit, and a smoothing circuit for smoothing the output of said amplifier, wherein the output of said smoothing circuit is negatively fed back to the input side of the oscillator circuit.

Another object of this invention is to provide an oscillatory-type amplifier apparatus comprising an oscillator circuit whose oscillation is controlled in accordance with the polarity of an input voltage, a transistor amplifier adapted to be switched on and off by the output of said oscillator circuit, a smoothing circuit for smoothing the output of said amplifier, and a computing circuit for computing the output of said smoothing circuit, wherein the output of said computing circuit is negatively fed back to the input side of the oscillator circuit.

Further object of this invention is to provide an oscillatory-type amplifier apparatus comprising an oscillator circuit whose oscillation is controlled in accordance with the polarity of an input voltage, an output transformer connected to said oscillator circuit, at least two output circuits each including a transistor amplifier adapted to be switched on and off by the output of the oscillator circuit and a smoothing circuit for smoothing the output of said amplifier, wherein each of said at least two output circuits is connected to the output transformer in such a manner as to be insulated from each other, and the output of one of said output circuits is negatively fed back to the input side of the oscillator circuit.

Still further object of this invention is to provide an oscillatory-type amplifier apparatus comprising an oscillator circuit whose oscillation is controlled in accordance with the polarity of an input voltage, said oscillator circuit including a transistor for oscillation and a temperature compensating circuit connected to the emitter circuit thereof in such a manner as to compensate for variations of a base-emitter voltage of said transistor caused by temperature changes, a transistor amplifier adapted to be switched on and off by the output of said oscillator circuit, and a smoothing circuit for smoothing the output of said amplifier, wherein the output of said smoothing circuit is negatively fed back to the input side of the oscillator circuit.

Other objects, features and advantages of this invention will become apparent from the following description taken in conjunction with the accompanying drawings, in which.

Figure 1:
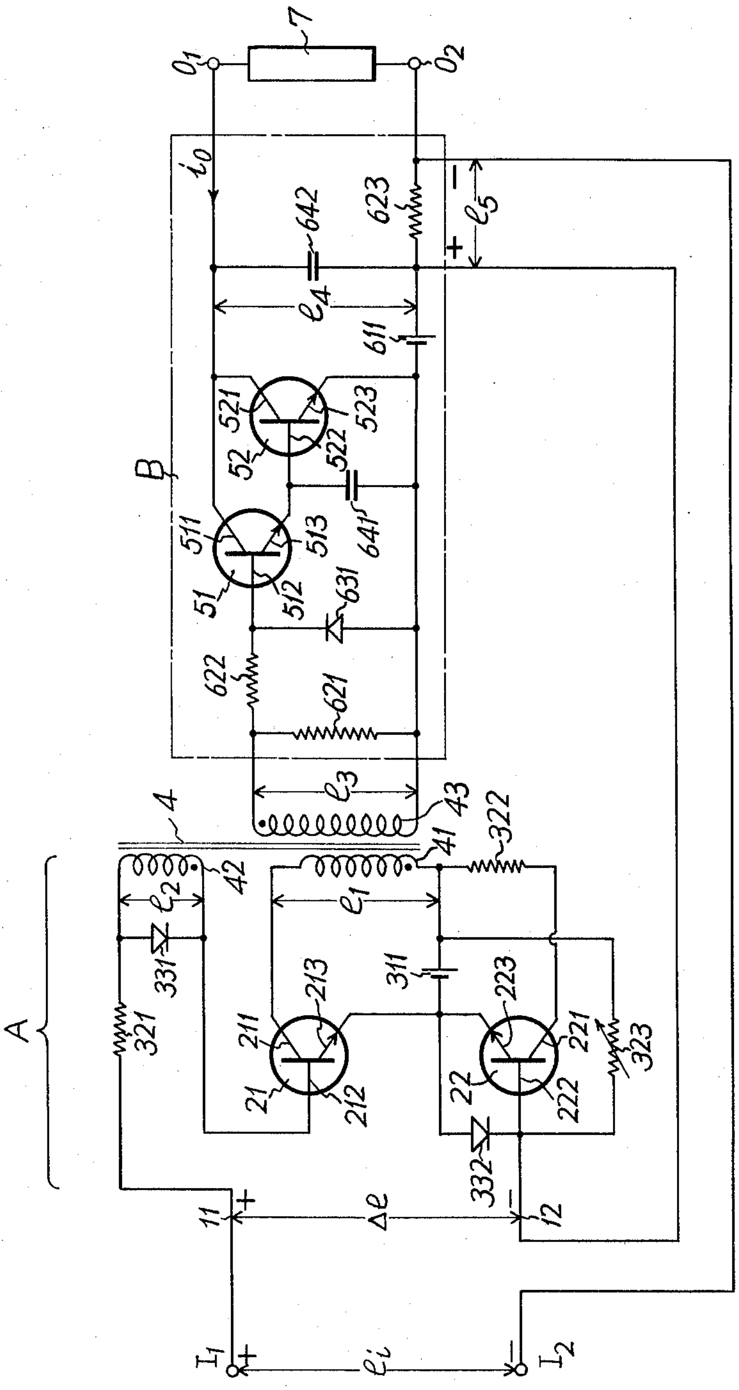
FIGURE 1 is a connection diagram illustrating an example of the amplifier apparatus according to this invention.
Figure 2:
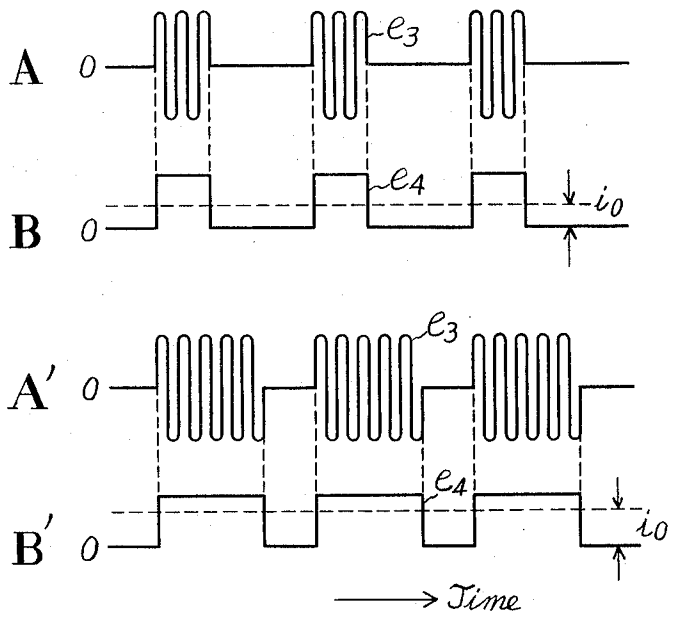
FIGURE 2 is a diagram for explaining the operation of the apparatus shown in FIGURE 1.

Referring to FIGURES 1 and 2, the principles of the present invention will hereinafter be explained. In FIGURE 1, $I_1$ and $I_2$ are input terminals and A generally designates an oscillator circuit, the oscillation of which is controlled according to the polarity of a D.C. voltage applied to the input terminals $I_1$ and $I_2$. The oscillator circuit A includes npn-type transistors 21 and 22, a D.C. power source 311, fixed resistors 321 and 322, a variable resistor 323, diodes 331 and 332 and an output transformer 4. The transformer 4 is of the type having a feedback coil 42 in addition to an input coil 41 and an output coil 43. Between the collector 211 and the emitter 213 of the transistor 21 is connected a series circuit of the input coil 41 of the transformer 4 and the power source 311. The feedback coil 42 of the transformer 4 and the resistor 321 are connected in series between the base 212 of the transistor 21 and an input terminal 11. The diode 331 is connected to both ends of the feedback coil 42. A series circuit of the power source 311 and the resistor 322 is connected between the collector 221 and the emitter 223 of the transistor 22, while its base 222 is connected through the diode 332 to the emitter 223 and further connected through the variable resistor 323 to the connecting point of the resistor 322 and the power source 311. The base 222 is directly connected to an input terminal 12. A circuit consisting of the transistor 21, the input coil 41 and feedback coil 42 of the transformer 4 constitutes a feedback type oscillator circuit. If, now, a forward voltage is applied between the base and emitter of the transistor 21 in its communtating direction (namely, a voltage $\Delta e$ of the polarity shown in the figure is applied between the input terminals 11 and 12), a current flows through the collector circuit of the transistor 21. In accordance with changes of the collector current, a voltage $e_1$ is induced in the input coil 41 of the transformer 4, whereby a voltage $e_2$ is induced in the feedback coil 42. The diode 331 is provided for short-circuiting a backward voltage induced in the feedback coil 42. The voltage $e_2$ of the feedback coil 42 causes the base current, accordingly the collector current to increase further. However, the collector current does not increase infinitely but is held at a certain value according to the saturation characteristic of transistor 21 or the transformer 4. In such a case, there is induced in the feedback coil 42 a voltage of a polarity reverse to that of the voltage $e_2$ previously produced and, its feedback action will cause the aforementioned base current, accordingly the collector current to be decreased. When the transistor 21 is turned off and the above-mentioned voltage of the reverse polarity is reduced to zero, the same operation as that described above is repeated again by a forward voltage applied between the base and emitter, thus performing oscillation. This oscillation continues so long as the forwrad voltage is applied between the base and emitter of the transistor 21. In case the ambient temperature rises, the transistor 21 is liable to produce an error by the fact that the voltage between the base and emitter is decreased. In the present invention, however, the transistor 22 is connected to the transistor 21 in such a manner that the voltage between the base and emitter of the former may be added in opposite polarity to that between the base and emitter of the latter, and further the bias of the transistor 22 can be controlled by the variable resistor 323. With this arrangement, the transistor 21 can be prevented from producing errors in operation due to temperature change, and hence precision of the oscillator circuit can be enhanced. The diode 332 is provided for passing therethrough the backward voltage between the base and emitter of the transistor 22.

Reference character B generally designates an output circuit connected to the output coil 43 of the transformer 4. The output circuit B comprises npn-type transistors 51 and 52, a D.C. power source 611, resistors 621 to 623 inclusive, a diode 631 and capacitors 641 and 642. The resistor 621 is connected to both ends of the output coil 43 of the transformer 4, and in turn a series circuit of the resistor 622 and the diode 631 is connected to both ends of the resistor 621. The base 512 of the transistor 51 is connected to one end of the diode 631, and the emitter 513 is connected through the capacitor 641 to the other end of the diode 631. The base 522 and the emitter 523 of the transistor 52 are connected to both ends of the capacitor 641, while a series circuit of the capacitor 642 and the power source 611 is connected between the collector 521 and the emitter 523. To both ends of the capacitor 642 is connected the resistor 623 through a load 7. The collectors 511 and 521 of the both transistors are connected to each other. The transistors 51 and 52 are amplifiers which perform switching action, each being turned on by a forward voltage applied between its base and emitter and effecting amplifying action. Where the output voltage $e_3$ of the transformer 4 is great, either one of the transistors may be omitted. The diode 631 is to short-circuit backward voltages of the transistors 51 and 52, and the capacitor 641 is provided for filtering. In the output circuit B, the voltage $e_3$ induced in the output coil 42 of the transformer 4 by the oscillation of the oscillator circuit A is applied to both ends of the resistor 621 and further applied through the resistor 622 to the base 512 of the transistor 51. When the transistors 51 and 52 are turned on, the power source 611 is connected to the capacitor 642 to charge it and the charged voltage is discharged through the load 7 and the resistor 623. Both ends of the resistor 623 are connected to the input circuit of the oscillator circuit A in such manner that a difference voltage between a voltage $e_5$ of the both ends and the input voltage $e_i$ may be impressed between the input terminals of the oscillator circuit A.

In this apparatus, when the voltage $e_i$ is applied between the input terminals $I_1$ and $I_2$ and the input terminal voltage $\Delta e$ of the oscillator circuit A is of the polarity shown in the figure (hereinafter referred to as "position"), the oscillator circuit A continues its oscillation, so that the voltage $e_3$ is induced in the output coil 43 of the transformer 4. When the voltage $\Delta e$ becomes negative in polarity the oscillation stops. The transistor 51 is turned on during a positive half cycle of the voltage $e_3$, while the transistor 52 is turned on during the oscillation of the oscillator circuit A to produce the voltage $e_4$, and the power source 611 is connected to the capacitor 642 for this time. Accordingly, the voltage $e_4$ impressed to the capacitor 642 becomes a voltage which intermittently varies depending upon whether the oscillating output of the oscillator circuit A is present or not, and the capacitor smooths this voltage.

If, now, a current $i_0$ supplied to the load 7 increases under the oscillating condition of the oscillator circuit A, the voltage $e_5$ produced at the both ends of the resistor 623 increases and the difference voltage $\Delta e$ between the input voltage $e_i$ and the voltage $e_5$ decreases. When the difference voltage $\Delta e$ decreases to zero, the oscillation of the oscillator circuit A ceases and the voltage $e_5$ drops. Then, when the voltage $\Delta e$ becomes again positive in polarity, the oscillator circuit A starts to oscillate and the same operation as that described above is repeated. Therefore, if the input voltage $e_i$ is small, the duration of the oscillation of the oscillator circuit A (accordingly the duration of the voltage $e_3$ of the output coil 43 of the transformer 4) is short as illustrated in FIGURE 2A. In addition, the voltage $e_4$ impressed to the capacitor 642 becomes a voltage of rectangular waveform having a short time width such as shown in FIGURE 2B and the mean value of the output current $i_0$ to be supplied to the load 7 is small as shown in dotted lines. On the contrary, in the case where the input voltage $e_i$ is great, the duration of the voltage $e_3$ is long in FIGURE 2A′ and the voltage $e_4$ becomes a voltage having a long time width as illustrated in FIGURE 2B′ and further the mean value of the output current $i_0$ increases. Accordingly, the D.C. output $i_0$ can be obtained exactly in proporton to the input voltage $e_i$ by the use of transistors of sufficiently great amplification degree as the transistors 51 and 52. The input voltage is not always required to be D.C. voltage and A.C. voltage may well be used so long as it is of a sufficiently low frequency, as compared with the oscillating frequency of the oscillator circuit A and the working frequency of the apparatus.

As has been described in the foregoing, the apparatus shown in FIGURE 1 comprises an oscillator circuit whose oscillation is controlled according to the polarity of an input voltage, and an output circuit connected thereto which consists of transistors having switching and amplifying action and a smoothing circuit for smoothing the output of the transistors, the output of the output circuit being negatively fed back to the input side of the oscillator circuit. Therefore, in accordance with this invention, a highly sensitive and efficient amplifier can be provided, the arrangement of which can be extremely simplified.

Figure 4:
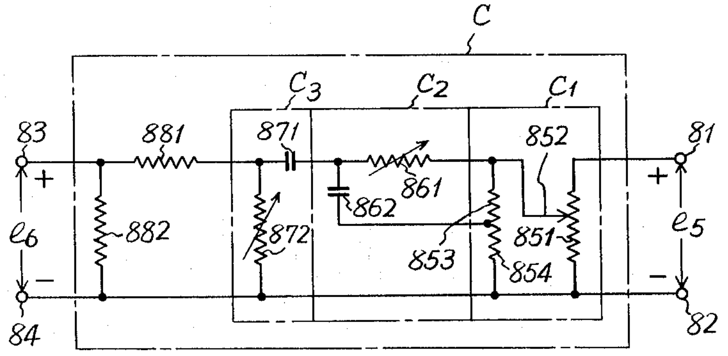
FIGURE 4 is a connection diagram of a computing circuit to be used in the indicating controller illustrated in FIGURE 3.
Figure 3:
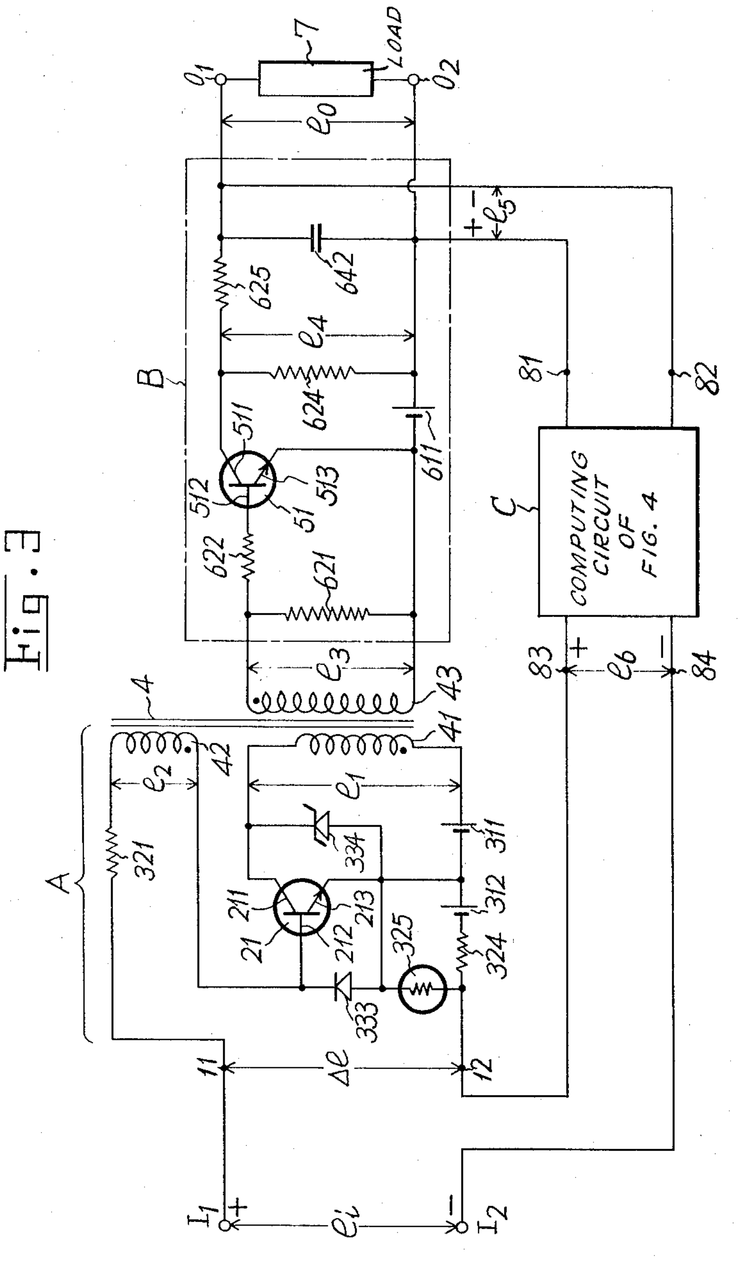
FIGURE 3 is a connection diagram illustrating another example of the amplifier apparatus of this invention as applied to an electric indicating controller.
Figure 5:
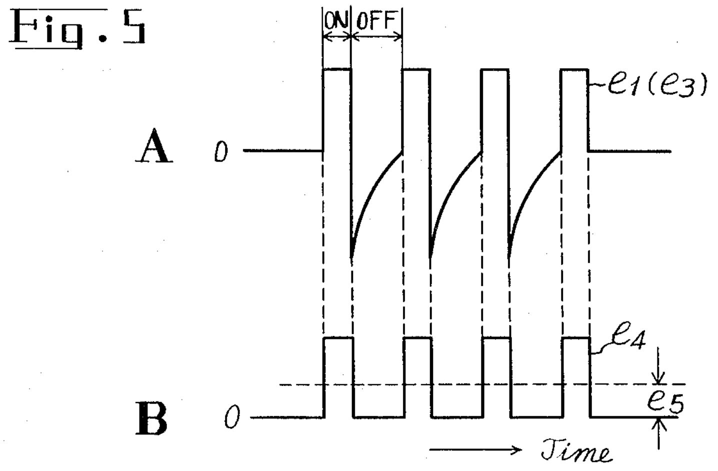
FIGURE 5 is a diagram for explaining the operation of the indicating controller shown in FIGURE 3.

Referring now to FIGURES 3 to 5 inclusive, an embodiment of this invention as applied to an electric indicating controller will hereinbelow be explained. The main differences between the indicating controller and the amplifier apparatus of FIGURE 1 are the provision of another temperature compensating circuit in the oscillator circuit A, the construction of the output circuit B with a single transistor, the negative feedback of a voltage output and the provision of a computing circuit in the feedback circuit. That is, in an oscillator circuit A, the reference numeral 325 designates a temperature-sensitive resistor, which is supplied with a predetermined current from a D.C. power source 312 and connected in such a manner that a voltage across the temperature-sensitive resistor and a base-emitter voltage of the transistor 21 may be in series with each other. Therefore, by the use of a temperature-sensitive resistor having a positive temperature coefficient such as, for example a resistor having wound thereon a copper wire, the oscillator circuit A can be prevented from producing errors due to a decrease of the base-emitter voltage of the transistor 21 which in turn is caused by an ambient temperature rise. In this case, a resistor having a lower resistance value than that of the resistor 324 is used as the temperature-sensitive resistor 325. The reference numeral 334 represents a Zener diode which serves to maintain the voltage across the emitter cathode junction of the transistor 21 less than the predetermined value of the inverse voltage caused by the input coil 41 of a transformer 4, thereby preventing breakdown of the transistor 21 by the inverse voltage. A diode 333 is provided for causing the input terminal voltage $\Delta e$ to correspond linearly to the oscillating output by short-circuiting the inverse voltage between the base and emitter of the transistor 21. In an output circuit B, a series circuit of a D.C. power source 611 and a resistor 624 is connected between the collector and emitter of a transistor 51, and a smoothing circuit composed of a resistor 625 and a capacitor 642 is connected to both ends of the resistor 624, output terminals of the smoothing circuit being connected through a computing circuit C to the input side of the oscillator circuit A in such a manner that a difference voltage between an input voltage $e_i$ and an output voltage $e_6$ of the computing circuit C may be impressed to the input terminal of the oscillator circuit A. In the output circuit B, a voltage $e_3$ to be induced in a transformer coil 43 by the oscillation of the oscillator circuit A is applied through a resistor 622 to the base 512 of a transistor 51, which transistor is turned on only when the voltage $e_3$ is a forward voltage. When the transistor 51 is off the energy stored in the output coil 43 of the transformer 4 is discharged through a resistor 621. As a result of this, there is caused at both ends of the resistor 624 a rectangular wave voltage $e_4$ such as shown in FIGURE 5B in response to the voltage $e_3$, namely the voltage $e_1$ across the input coil 41 of the transformer 4. The voltage $e_4$ is smoothed by the smoothing circuit consisting of the resistor 625 and the capacitor 642, producing across the capacitor 642 a D.C. voltage $e_5$ in proportion to the mean value of the voltage $e_4$. The computing circuit C comprises a voltage divider circuit $C_1$ including a variable voltage divider 851 and resistors 853 and 854, an integration circuit $C_2$ including a variable resistor 861 and a capacitor 862 and a differentiating circuit $C_3$ including a capacitor 871 and a variable resistor 872, as illustrated in FIGURE 4. Between output terminals 83 and 84 of the computing circuit C, there is obtained a voltage $e_6$ which is proportionate to proportion, integration and differentiation of the voltage $e_5$ applied between input terminals 81 and 82. That is, a voltage $K \cdot e_5$ is obtained (K is a proportional constant).

In the indicating controller illustrated in the figure, while the input voltage $\Delta e$ of the oscillator circuit A is positive in polarity and the oscillation of the oscillator circuit A continues, the voltage of $e_5$ across the capacitor 642 of the output circuit B increases, with the result that the output voltage $e_6$ of the computing circuit C also increases and the voltage $\Delta e$ decreases. When the voltage $\Delta e$ is reduced to zero, the oscillation of the oscillator circuit A ceases and the output voltage $e_6$ of the computing circuit C drops. Then, when the voltage $\Delta e$ becomes positive again, the oscillation starts and the same operation is repeated. Therefore, if a transistor of high amplification degree is used as the transistor 51 of the output circuit B and the gain of the circuits from the oscillator circuit A to the both ends of the capacitor 642 is selected sufficiently large, the output voltage $e_0$ of the circuit B can be made proportionate to the product of the value of the input voltage $e_i$ and $l/k$. Accordingly, in the apparatus illustrated in the figure, the ratio of the output voltage $e_0$ to the input voltage $e_i$, accordingly a set-value of the proportional constant can be determined as desired by sliding a brush 852 of the voltage divider circuit $C_1$ of the computing circuit C. By controlling the variable resistor 872 of the differentiation circuit $C_3$, it is possible to adjust as desired a set-value of the integration constant for determining the integration performance characteristics of this apparatus. In addition, a set-value of the differentiation constant for determining the differentiation performance characteristics can also be adjusted as is desired by controlling the variable resistor 861 of the integration circuit $C_2$.

In this example, the computing circuit C is composed of the variable voltage divider circuit $C_1$, the integration circuit $C_2$ and the differentiation circuit $C_3$. However, it is also possible to form the computing circuit by any one of the above circuits or a combination of any two of them in accordance with the property of the object to be controlled.

As has been described in the foregoing, the apparatus illustrated in FIGURE 3 comprises the oscillator circuit whose oscillation is controlled according to the polarity of the input voltage and the output circuit connected thereto which consists of the transistor having switching and amplifying actions and the smoothing circuit for smoothing the output of the transistor, in which the output of the output circuit is negatively fed back to the input side of the oscillator circuit through the computing circuit. Therefore, a highly sensitive and efficient indicating controller having a desired performance characteristic can be provided, the arrangement of which is extremely simplified.

Figure 6:
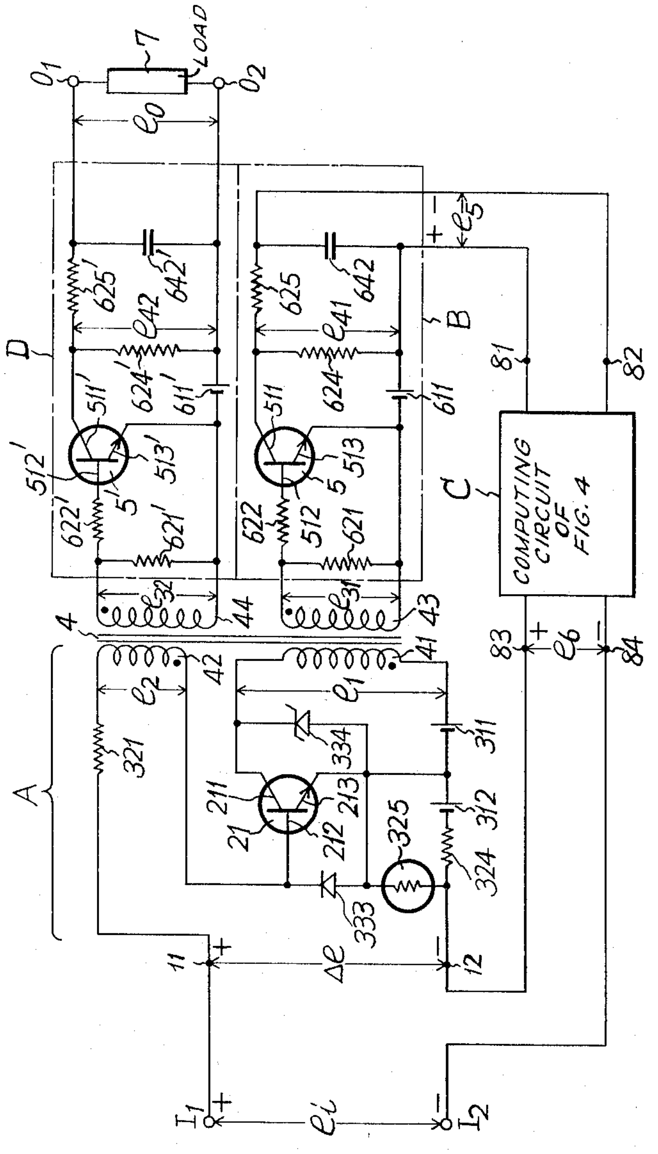
FIGURE 6 is a connection diagram illustrating another example of the amplifier apparatus of this invention as applied to an input-output insulating type indicating controller.

FIGURE 6 is a connection diagram illustrating another embodiment of the present invention amplifier apparatus as applied to an input-output insulating type indicating controller. The main differences between this indicating controller and that shown in FIGURE 3 reside in that a transformer provided with a second output coil 44 is used as an output transformer 4 and in that a second output circuit D of substantially the same structure as an output circuit B is connected to both ends of the output coil 44, a load being connected to the output terminal of the output circuit D. In this case, it is possible to make substantially identical the frequency response characteristics of one circuit consisting of the oscillator circuit A and the first output circuit B and the other circuit including the oscillator circuit A and the second output circuit D, by arranging the first and second output circuits B and D in such a manner that the time constants of their respective smoothing circuits may be substantially equal.

The apparatus of this example is provided with two output circuits but it may be formed of more than three output circuits. In such a case, the output transformer may be divided into more than three.

As has been described above, the apparatus shown in FIGURE 6 comprises an oscillator circuit whose oscillation is controlled according to the polarity of an input voltage and a plurality of output circuits each including a transistor having switching and amplifying actions and a smoothing circuit for smoothing the output of the transistor, the plurality of output circuits each being connected to the oscillator circuit in such a manner as to be insulated from the others in direct current, and an output of one of the output circuits being fed back negative to the input side of the oscillator circuit through a computing circuit. With this arrangement, an input-output insulating type indicating controller having a desired performance characteristic and high sensitivity and efficiency can be provided, the arrangement of which can be extremely simplified.

In the input-output insulating type indicating controller shown in FIGURE 6 an output of one of the output circuits is fed back to the input side of the oscillator circuit through the computing circuit. Furthermore, it is a matter of course that a highly sensitive and efficient input-output insulating type amplifier apparatus can be produced with an arrangement such that the output of one of the output circuits is fed back directly to the input side of the oscillator circuit.

Figure 7:
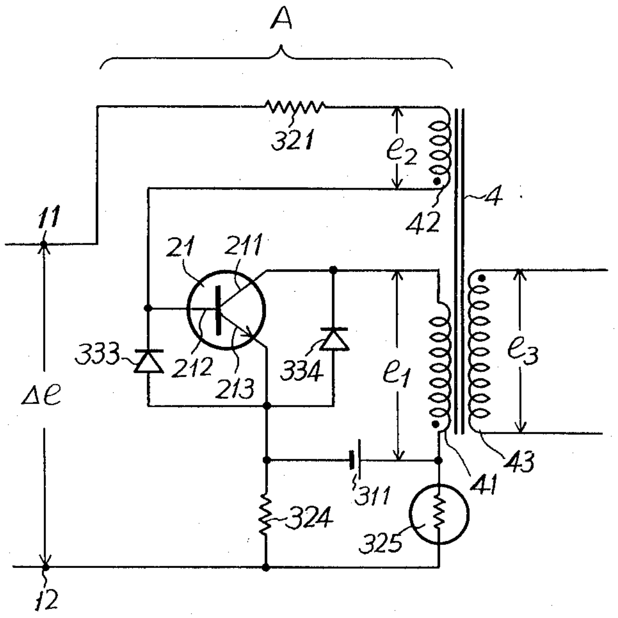
FIGURE 7 is a connection diagram illustrating another example of the oscillator circuit used in the amplifier apparatus of this invention.

FIGURE 7 is a connection diagram illustrating another example of the oscillator circuit A. In the oscillator circuit A a certain output of a D.C. power source 311 for oscillation is supplied to a series circuit of a temperature-sensitive resistor 325 and a resistor 324, too. By resistance variations of the temperature-sensitive resistor 325 due to the ambient temperature, a voltage across the resistor 324 is changed, thereby compensating for variations in a base-emitter voltage of a transistor 21 due to variations in the ambient temperature. In this case, the temperature-sensitive resistor 325 has a higher resistance value than the resistor 324. With this arrangement, there is no need of providing a D.C. power source specifically for a temperature compensating circuit and the D.C. power source 311 for oscillation can be used in common, so that the structure of the oscillator circuit A can be extremely simplified.

It will be apparent that many modifications and variations may be effected without departing from the scope of the novel concept of this invention.

What is claimed is:

1. An oscillator-type amplifier apparatus comprising: an oscillator circuit including input terminals, a transistor having a base, an emitter, and a collector, and a transformer having a primary winding, a feedback winding, and an output winding, said primary winding being connected between said collector and said emitter of said transistor, said feedback winding being connected between one of said input terminals and said base of said transistor for positively feeding back a voltage which is induced in said feedback winding to cause said output winding to develop an output signal in accordance with the polarity of a control voltage applied to said input terminals; an output circuit including an amplifier adapted to be switched on and off in accordance with said output signal of said oscillator circuit for developing a load current; a filter circuit connected to said amplifier to filter said load current; and a feedback circuit connected to said amplifier for feeding back a portion of said load current to said input terminals of said oscillator circuit to reverse the polarity of said control voltage thereby terminating the operation of said oscillator circuit.

2. An oscillator-type amplifier apparatus comprising: an oscillator circuit having a pair of input terminals for receiving a voltage of given polarity to cause an output from said oscillator circuit; an amplifier circuit; means coupling said output of said oscillator circuit to said amplifier circuit, said amplifier circuit producing an amplified signal in accordance with said output; filter means in said amplifier circuit for filtering said amplified signal to produce a load current; and feedback means connected between said filter means and said pair of input terminals to apply thereto a voltage of opposite polarity with respect to said voltage of given polarity, said voltage of opposite polarity being responsive to said load current; whereby, the voltages of said given polarity and of said opposite polarity are combined to produce a resultant voltage which has the same polarity as said voltage of opposite polarity to render said oscillator circuit inoperative, thereby regulating said load current.

3. The oscillator-type amplifier circuit apparatus of claim 2 further including: means connected in circuit with said feedback means to cause said voltage of opposite polarity to be a proportionate value of said load current.

4. The oscillator-type amplifier circuit apparatus of claim 2 wherein said oscillator circuit includes: a transistor for producing said output; and temperature compensating means connected in circuit with said transistor for maintaining the operation of said transistor substantially constant despite temperature variation of said transistor.

References Cited by the Examiner

UNITED STATES PATENTS

| | | | |
|---|---|---|---|
| 2,987,664 | 6/1961 | Poirier et al. | 331—112 |
| 3,117,270 | 1/1964 | Tailleur | 331—113 |
| 3,145,334 | 8/1964 | Berman | 321—2 |
| 3,200,348 | 8/1965 | Kammiller et al. | 331—113 |

FOREIGN PATENTS

| | |
|---|---|
| 826,783 | Great Britain. |

ROY LAKE, *Primary Examiner.*

J. KOMINSKI, *Assistant Examiner.*